United States Patent
Chung et al.

(10) Patent No.: US 6,209,190 B1
(45) Date of Patent: Apr. 3, 2001

(54) PRODUCTION OF MGO DISPERSED BI-2223 SUPERCONDUCTOR

(75) Inventors: Hyung Sik Chung, Changwon-Si; Hai Doo Kim; Jae Woong Ko, both of Sangnam-Dong, all of (KR)

(73) Assignee: The Korea Institute of Machinery & Materials (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 27 days.

(21) Appl. No.: 08/642,538

(22) Filed: May 3, 1996

(51) Int. Cl.$^7$ .................................................. H01L 39/24
(52) U.S. Cl. .......................... 29/599; 505/433; 505/425
(58) Field of Search ........................... 29/599; 505/100, 505/121, 300, 320, 425, 433

(56) References Cited

U.S. PATENT DOCUMENTS

| | | | |
|---|---|---|---|
| 5,028,585 | * | 7/1991 | Spencer ................................. 505/121 |
| 5,061,683 | * | 10/1991 | Horowitz ........................ 505/425 X |
| 5,079,215 | * | 1/1992 | Kugimiya et al. ................... 505/121 |
| 5,118,659 | * | 6/1992 | Lafon et al. ......................... 505/425 |
| 5,152,973 | * | 10/1992 | Spencer ................................ 505/425 |
| 5,238,911 | * | 8/1993 | Kuwajima et al. .................. 505/121 |
| 5,284,822 | * | 2/1994 | Sakai et al. ..................... 505/121 X |
| 5,409,890 | * | 4/1995 | Yamamoto et al. ............... 29/599 X |

FOREIGN PATENT DOCUMENTS

| | | | | |
|---|---|---|---|---|
| 0564238 A1 | * | 10/1993 | (EP) | ..................................... 505/121 |
| 5-310428 | * | 11/1993 | (JP) | ..................................... 505/121 |

OTHER PUBLICATIONS

Yoo et al., "Effect of MgO Particles on Microstrucutral Development and Superconducting Properties of Bi–2223 Phase"; IEEE Transactions on Applied Superconductivity, vol. 5, No. 2, Jun. 1995, pp. 1479–1481.

Ko et al., "Fabrication and Properties of Ultra Fine MgO Added Bi–2223/MgO/Ag Tapes"; Advances in Super Conductivity, Proceedings of the 8th International Symposium on Superconductivity (ISS '95), Oct. 30–Nov. 2, 1995;ISTEC, vol. 2; pp. 839–842.

* cited by examiner

Primary Examiner—S. Thomas Hughes
(74) Attorney, Agent, or Firm—Banner & Witcoff, Ltd.

(57) ABSTRACT

A process for producing Bi-2223 high $T_c$ superconductor in which fine MgO particles (<0.1 $\mu$m) are homogeneously distributed to provide flux pinning centers in Bi-2223 high $T_c$ superconductor in order to give enhanced critical current density under magnetic field, as compared to the Bi-2223 high $T_c$ superconductor without MgO dispersion, when processed under similar conditions. The process comprises mixing partially converted Bi-2223 powder and MgO fine particles, drying to give mixed powder, filling in silver tube, drawing, rolling and heat-treating at a temperature and for a time sufficient to form Bi-2223 high $T_c$ superconductor in which fine MgO particles are homogeneously distributed.

1 Claim, No Drawings

PRODUCTION OF MGO DISPERSED BI-2223 SUPERCONDUCTOR

BACKGROUND OF THE INVENTION

1. Field of the Invention

The present invention relates to high $T_c$ superconductor and more particularly to fine MgO dispersed Bi-2223 high $T_c$ superconductor.

2. Description of the Prior Art

Since the discovery of high-$T_c$ oxide superconductor, many studies have been made to obtain wire with high critical current density. Microstructural control is important to keep the high critical current density under magnetic field for practical application of superconducting materials. Major problems in BSCCO superconductors are impurities in grain boundary and degradation of Jc under magnetic field due to flux creep. It is relatively easier to process BSCCO superconducting systems to high Jc as compared to YBCO due to their low melting temperature and aligning texturing by a proper mechanical or thermal processing. However, this system exhibits a serious flux creep behavior under magnetic field, requiring very effective flux pinning centers. In YBCO system, it was reported that finely dispersed non-superconducting 211 particles provided flux pinning mechanism. It seems that non-superconducting fine particle which does not react with superconducting matrix can provide flux pinning mechanism.

It is well known that significant magnetic field penetration can occur in the interior of BSCCO superconductors above a critical magnetic field (Hc 1). If the magnetic flux lines within the superconductor are not strongly pinned in place, then Lorentz forces can cause the flux lines to migrate, resulting in resistive energy dissipation. The BSCCO superconductors have been found to exhibit significant flux creep in modest magnetic fields at temperatures well below the critical temperature.

Therefore, the application of these materials in high magnetic fields is seriously limited unless the flux creep is reduced by enhanced flux pinning. The operating temperature and magnetic field will have to be reduced to less than 30K, and few tesla for the BSCCO system. Based on the observation of Yamaguchi et al. who increased the pinning of YBCO ceramics by the introduction of the second phase [see J. Mater.Res. 6, 1404 (1991)], several researchers claimed that $Ca_2CuO_3$ increases the pinning of the 2212 and 2223 phase of the BSCCO superconductors. However, the grains of powdered metallurgically processed ceramics are too large (1–100 $\mu$m) to act as effective pinning centers.

SUMMARY OF THE INVENTION

It is, therefore, an object of the present invention to overcome the flux creep behavior under magnetic field.

In order to accomplish the above object, the present invention uses fine MgO particle. MgO is known not to react with Bi-2223 superconductor and very fine MgO particles such as 100 Å in size are available commercially. The present invention provides a method by which addition of very fine MgO particle in Bi-2223 superconductor can improve the critical current density under magnetic field.

In accordance with the present invention mixture of Bi, Pb, Sr, Ca, Cu salts is pre-reacted to give intermediate phases such as Bi-2223, Bi-2212 and $Ca_2PbO_4$ because it is known that the complete conversion to Bi-2223 is very sluggish.

The pre-reacted powder is mixed with the appropriate amount of fine MgO particles and heat-treated to give B-2223 superconductor in which fine MgO particles are embedded. The resulting microstructure is such that fine MgO particles are trapped inside the Bi-2223 grains. When MgO particles are located at grain boundaries of Bi-2223 grains they provide weak links which decrease the critical current density.

DESCRIPTION OF THE PREFERRED EMBODIMENTS

In order to obtain the homogeneous distribution of fine MgO particle in Bi-2223 matrix the detailed procedure for the fabrication of this product is described as follows;

1. Preparation of the mixed powder:

Cationic ratio of the composition is Bi:Pb:Sr:Ca:Cu=2−x:y:2:2.2:3 where x,y=0.2–0.4.

Pb, Sr, Ca, Cu salts (nitrate or acetate)of which cationic ratio is y:2:2,2:3(y=0.2–0.4) are dissolved in distilled water.

Bi nitrate corresponding to 2−x in the composition is dissolved in distilled water by adding $HNO_3$.

The above two solutions are mixed in stirrer and spray-dried to prepare granules.

The above granules are calcined at 800–820° C. for 3 hours.

The above calcined powder is heat-treated at 830–835° C. for 30 to 100 hours to convert to partial Bi-2223 phase.

2–30% by volume of MgO or corresponding Mg salts (nitrate or acetate) is added to partially converted Bi-2223 powders together with binder (Poly Vinyl Butyral), deflocculant (Manhathan Fish Oil) and solvent (methanol, isobuthanol).

The above mixture is ball milled or planetary-ball-milled at least 1 hour, followed by the ultrasonic treatment.

The above slurry is dried on hot plate while stirring.

2. Fabrication

The said powder is filled in silver tube, drawn and rolled to produce tape, followed by heat-treatment at 830–850° C. for 10–200 hours.

The following table 1 shows the effect of MgO addition on the critical current density of Bi-2223 high $T_c$ superconducting tape under magnetic field.

TABLE 1

Critical density of Bi-2223 high $T_c$ superconductor under magnetic field at 50K ($A/cm^2$)

| Magnetic field | MgO addition (wt %) | | | | |
| --- | --- | --- | --- | --- | --- |
| | 0 | 5 | 10 | 15 | 30 |
| 0 tesla | 19,000 | 45,000 | 40,000 | 30,000 | 20,000 |
| 1 tesla | 1,000 | 18,000 | 7,000 | 6,000 | 5,000 |
| 2 tesla | 700 | 16,000 | 3,000 | 2,000 | 1,000 |
| 3 tesla | 500 | 13,000 | 2,000 | 1,500 | 800 |

Having described preferred embodiments of the present invention, it is to be recognized that variations and modifications thereof within the spirit of the invention may become apparent to those skilled in the art, and the scope of the invention is to be determined by the appended claims and their equivalents.

What is claimed is:

1. A process for manufacturing fine MgO particles homogeneously distributed in Bi-2223 high $T_c$ superconductor grains having a composition of Bi:Pb:Sr:Ca:Cu=2−x:y:2:2.2:3 where x and y are 0.2–0.4 comprising the steps of:

a) preparing a water-based Pb, Sr, Ca, Cu salt solution and a water-based Bi salt solution separately and then mixing the solutions together to form a single solution;

b) spray drying the single solution to form a spray-dried powder, calcining the spray-dried powder to form a calcined powder, and heat-treating the calcined powder to form a heat-treated calcined powder;

c) adding 2–30% by volume of MgO particles having a particle size of less than 0.1 μm to the heat-treated calcined powder along with a binder, a deflocculant and a solvent to form a MgO-containing solution, then ball milling and subjecting the MgO-containing solution to ultrasonic treatment to obtain a slurry;

d) drying the slurry to give a mixed powder; and e) filling a silver tube with the powder, and then drawing and rolling to produce a tape, and heat treating at 830–850° C. for 10–200 hrs, whereby the MgO particles are embedded in the Bi-2223 superconductor grains.

* * * * *

UNITED STATES PATENT AND TRADEMARK OFFICE
CERTIFICATE OF CORRECTION

PATENT NO. : 6,209,190 B1
DATED : April 3, 2001
INVENTOR(S) : Hyung Sik Chung et al.

It is certified that error appears in the above-identified patent and that said Letters Patent is hereby corrected as shown below:

Title page,
Item [75], Inventors:

"Hyung Sik Chung. Changwon-Si; Hai Doo Kim; Jae Woong Ko. both of Sangnam-Dong, all of (KR)" has been replaced with -- Hyung Sik Chung; Hai Doo Kim; Jae Woong Ko. all of Changwon-si Kyungsangnam-do, all of Korea --.

Signed and Sealed this

Eleventh Day of December, 2001

*Attest:*

NICHOLAS P. GODICI
*Attesting Officer*  *Acting Director of the United States Patent and Trademark Office*